United States Patent
De Moura et al.

(10) Patent No.: US 7,653,520 B2
(45) Date of Patent: Jan. 26, 2010

(54) METHOD FOR COMBINING DECISION PROCEDURES WITH SATISFIABILITY SOLVERS

(75) Inventors: Leonardo De Moura, Fremont, CA (US); Harald Ruess, Palo Alto, CA (US)

(73) Assignee: SRI International, Menlo Park, CA (US)

( * ) Notice: Subject to any disclaimer, the term of this patent is extended or adjusted under 35 U.S.C. 154(b) by 424 days.

(21) Appl. No.: 10/431,780

(22) Filed: May 8, 2003

(65) Prior Publication Data

US 2004/0019468 A1    Jan. 29, 2004

Related U.S. Application Data

(60) Provisional application No. 60/397,201, filed on Jul. 19, 2002.

(51) Int. Cl.
G06F 17/10    (2006.01)

(52) U.S. Cl. .............................. 703/2; 703/21; 703/22; 706/46; 706/58; 717/124; 708/802; 716/3; 716/4

(58) Field of Classification Search .................. 703/2, 703/22, 21; 716/3–5; 706/46, 58
See application file for complete search history.

(56) References Cited

U.S. PATENT DOCUMENTS

| | | | | |
|---|---|---|---|---|
| 5,163,016 A * | 11/1992 | Har'El et al. | ............. | 716/5 |
| 5,276,897 A | 1/1994 | Stalmarck | | |
| 6,038,392 A | 3/2000 | Ashar et al. | | |
| 6,061,812 A * | 5/2000 | Holzmann et al. | ............. | 714/38 |
| 6,185,516 B1 * | 2/2001 | Hardin et al. | ............. | 703/2 |
| 6,247,164 B1 | 6/2001 | Ashar et al. | | |
| 6,311,293 B1 * | 10/2001 | Kurshan et al. | ............. | 714/37 |
| 6,324,496 B1 * | 11/2001 | Alur et al. | ............. | 703/17 |
| 6,346,879 B1 * | 2/2002 | Peled | ............. | 340/500 |
| 6,415,430 B1 | 7/2002 | Ashar et al. | | |
| 6,526,544 B1 * | 2/2003 | Peled et al. | ............. | 716/4 |
| 6,591,400 B1 * | 7/2003 | Yang | ............. | 716/2 |
| 6,654,715 B1 * | 11/2003 | Iwashita | ............. | 703/22 |
| 6,691,078 B1 * | 2/2004 | Beer et al. | ............. | 703/14 |
| 6,728,665 B1 * | 4/2004 | Gupta et al. | ............. | 703/2 |
| 6,848,088 B1 * | 1/2005 | Levitt et al. | ............. | 716/4 |
| 6,944,838 B2 * | 9/2005 | McMillan | ............. | 716/5 |
| 6,957,178 B2 * | 10/2005 | Musliner et al. | ............. | 703/15 |
| 7,028,279 B2 * | 4/2006 | Jain et al. | ............. | 716/5 |
| 2002/0053064 A1 | 5/2002 | Gupta et al. | | |
| 2002/0123867 A1 | 9/2002 | Shtrichman | | |
| 2002/0138812 A1 | 9/2002 | Johannsen | | |

(Continued)

OTHER PUBLICATIONS

L. D. Moura, H. Rues, and M. Sorea, "Lazy Theorem Proving for Bounded Model Checking over Infinite Domains" Spring-Verlag, Jul. 2002.*

(Continued)

Primary Examiner—Kamini S Shah
Assistant Examiner—Kibrom Gebresilassie

(57) ABSTRACT

The invention provides bounded model checking of a program with respect to a property of interest comprising unfolding the program for a number of steps to create a program formula; translating the property of interest into an automaton; encoding the transition system of the automaton into a Boolean formula creating a transition formula; conjoining the program formula with the transition formula to create a conjoined formula; and deciding the satisfiability of the conjoined formula.

20 Claims, 7 Drawing Sheets

U.S. PATENT DOCUMENTS

| | | | |
|---|---|---|---|
| 2002/0178424 | A1 | 11/2002 | Gupta et al. |
| 2003/0182638 | A1* | 9/2003 | Gupta et al. ............... 716/4 |
| 2003/0225552 | A1* | 12/2003 | Ganai et al. ............... 703/2 |
| 2004/0123254 | A1* | 6/2004 | Geist et al. ............... 716/4 |
| 2006/0010428 | A1* | 1/2006 | Rushby et al. ........... 717/124 |
| 2006/0136879 | A1* | 6/2006 | Singh et al. ............. 717/136 |
| 2006/0282806 | A1* | 12/2006 | Cadambi et al. ........... 716/5 |
| 2007/0118340 | A1* | 5/2007 | Geist et al. ............... 703/2 |
| 2008/0098347 | A1* | 4/2008 | Chockler et al. ........ 717/104 |
| 2009/0064064 | A1* | 3/2009 | Eisner et al. ............. 716/5 |

OTHER PUBLICATIONS

H. Saidi, and N. Shankar, "Abstract and Model Check while You Prove", CAV'99, pp. 1-12.*

S. Das, D. L. Dill, and S. Park, "Experience with Predicate Abstraction", 1999, pp. 160-171.*

L. D. Moura, H. Rues, and M. Sorea, "Lazy Theorem Proving for Bounded Model Checking over Infinite Domains", 2002, pp. 1-18.*

T. Ball, and R. Majumdar, "Automatic Predicate Abstraction of C Program", 2001, pp. 1-11.*

G. Audemard, A. Cimatti, A. Kornilowicz, R. Sebastiani, "Bounded Model Checking for Timed Systems" pp. 243-259, 2002.*

T. Schuele, and K. Schneider, "Bounded Model Checking of Infinite State System: Exploiting the Automata Hierarchy" 2004 IEEE, pp. 17-26.*

Alur et al., "Model-checking for real-time systems," 5th Symp. on Logic in Computer Science (LICS'90), 1990, pp. 414-425.

Barrett et al., "Checking satisfiability of first-order formulas by incremental translation to SAT," LNCS 2404, 2002, pp. 236-249.

Biere et al., "Symbolic model checking without BDDs," LNCS 1579, 1999.

Bryant et al., "Graph-based algorithms for Boolean function manipulation," IEEE Trans. on Computers, 1986, pp. 677-691, C-35(8).

Bryant et al., "Exploiting positive equality in a logic of equality with uninterpreted functions," LNCS 1633, 1999, pp. 470-482.

Clarke et al., "Counterexample-guided abstraction refinement," LNCS 1855, 2000, pp. 154-169.

Clarke et al., "Bounded model checking using satisfiability solving," Formal Methods in System Design, 2001, pp. 7-34, 19(1).

Copty et al., "Benefits of bounded model checking at an industrial setting," LNCS 2102, 2001, pp. 436-453.

Das et al., "Successive approximatoin of abstract transition relations," Symp. on Logic in Computer Science, 2001, pp. 51-60, IEEE.

Filliatre et al., "ICS: Integrated canonizer and solver," LNCS 2102, 2001, pp. 246-249.

Gerth et al., "Simple on-the-fly automatic verification of linear temporal logic," Protocol Specification Testing and Verification, 1995, pp. 3-18, CHapman & Hall.

Goel et al., "BDD based procedures for a theory of equality with uninterpreted functions," LNCS 1427, 1998, pp. 244-255.

Henzinger et al., "Symbolic model checking for real-time systems," Information & Computation, 1994, pp. 193-244, 111(2).

Henzinger et al., "Lazy Abstraction," ACM SIGPLAN Notices, 2002, pp. 58-70, 31(1).

Kupferman et al., "Model checking of safety properties," Formal Methods in System Design, 2001, pp. 291-314, 19(3).

Lachnech et al., "Incremental verification by abstraction," LNCS 2031, 2001, pp. 98-112.

Moller et al., "Predicate abstraction for dense real-time systems," Electronic Notes in Theoretical Computer Science, 2002, 65(6).

Moller et al., "Solving bit-vector equations," LNCS 1522, 1998, pp. 36-48.

Moskewicz et al., "Chaff: Engineering an efficient SAT solver," Proc. 38th Design Automation Conference, 2001.

Nelson et al., "Simplification by cooperating decision procedures," ACM TRANSPLAS, 1979, pp. 245-257, 1(2).

Owre et al., "PVS: A prototype verification system," 11th Int'l Conf. on Automated Deduction, LNAI 607, 1992, pp. 748-752.

Plaisted et al., "A structure preserving clause form translation," Journal of Symbolic Computation, 1986, pp. 293-304, 2(3).

Pnueli et al., "Deciding equality formulas by small domains instantiations," LNCS 1633, 1999, pp. 455-469.

Ruess et al., "Deconstructing Shostak," 16th Symp. on Logic in Computer Science, 2001, IEEE.

Rusu et al., "On proving safety properties by integrating static analysis, theorem proving and abstraction," LNCS 1579, 1999, pp. 178-192.

Saidi et al., "Modular and incremental analysis of concurrent software systems," 14th IEEE Int'l Conf. on Automated Software Engineering, 1999, pp. 92-101, IEEE.

Shostak, "Deciding linear inequalities by computing loop residues," J. of the ACM, 1981, pp. 769-779, 28(4).

Sistla, "Safety, liveness and fairness in temporal logic," Formal Aspects of Computing, 1994, pp. 495-512, 6(5).

* cited by examiner

Fig. 1

```
sat (φ)
    p := α(φ);
    loop
        v := B - sat(p);
        if v = ⊥ then return ⊥ ;
        if C - sat(γ(v)) ≠ ⊥ then return     choose (γ(v));
        I :=   ⋁    ¬ α(c);  p := p ∧ I
             c∈γ(v)
    endloop
```

METHOD FOR COMBINING DECISION PROCEDURES WITH SATISFIABILITY SOLVERS

RELATED APPLICATIONS

This Application claims priority from U.S. Provisional Application Ser. No. 60/397,201 filed Jul. 19, 2002.

REFERENCE TO GOVERNMENT FUNDING

This invention was made with Government support under Contract Number CCR-0082560 awarded by the National Science Foundation. The Government has certain rights in this invention.

FIELD OF INVENTION

This invention relates to the field of formal methods and, more particularly, to automated decision procedures. The precise scope of the disclosed technique should be evident from the claims.

BACKGROUND OF THE INVENTION

The following papers provide useful background information, for which they are incorporated herein by reference in their entirety, and are selectively referred to in the remainder of this disclosure by their accompanying reference numbers in square brackets (i.e., [4] for the fourth paper, by R. E. Bryant).

[1] R. Alur, C. Courcoubetis, and D. Dill. Model-checking for real-time systems. 5*th Symp. On Logic in Computer Science (LICS* 90), pages 414-425, 1990.

[2] C. W. Barrett, D. L. Dill, and A. Stump. Checking Satisfiability of First-Order Formulas by Incremental Translation to SAT. LNCS, 2404:236-249, 2002.

[3] A. Biere, A. Cimatti, E. M. Clarke, and Y. Zh. Symbolic model checking without BDDs. *LNCS,* 1579, 1999.

[4] R. E. Bryant. Graph-based algorithms for Boolean function manipulation. *IEEE Transactions on Computers*, C-35 (8):677-691, August 1986.

[5] R. E. Bryant, S. German, and M. N. Velev. Exploiting positive equality in a logic of equality with uninterpreted functions. *LNCS,* 1633:470-482, 1999.

[6] Edmund M. Clarke, Orna Grumberg, Somesh Jha, Yuan Lu, and Helmut Veith. Counterexample-guided abstraction refinement. *LNCS,* 1855:154-169, 2000.

[7] E. M. Clarke, A. Biere, R. Raimi, and Y. Zhu. Bounded model checking using satisfiability solving. *Formal Methods in System Design,* 19(1):7-34, 2001.

[8] F. Copty, L. Fix, R. Fraer, E. Giunchiglia, G. Kamhi, A. Tacchella, and M. Y. Vardi. Benefits of bounded model checking in an industrial setting. *LNCS,* 2101:436-453, 2001.

[9] Satyaki Das and David L. Dill. Successive approximation of abstract transition relations. In *Symposium on Logic in Computer Science,* pages 51-60. IEEE, 2001.

[10] J.-C. Filliâtre, S. Owre, H. Rueβ, and N. Shankar. ICS: Integrated Canonizer and Solver. *LNCS,* 2102:246-249, 2001.

[11] Rob Gerth, Doron Peled, Moshe Vardi, and Pierre Wolper. Simple on-the-fly automatic verification of linear temporal logic. In *Protocol Specification Testing and Verification*, pages 3-18, Warsaw, Poland, 1995. Chapman & Hall.

[12] A. Goel, K. Sajid, H. Zhou, and A. Aziz. BDD based procedures for a theory of equality with uninterpreted functions. *LNCS,* 1427:244-255, 1998.

[13] T. A. Henzinger, X. Nicollin, J. Sifakis, and S. Yovine. Symbolic model checking for real-time systems. *Information and Computation,* 111(2):193-244, June 1994.

[14] Thomas A. Henzinger, Ranjit Jhala, Rupak Majumdar, and Grégoire Sutre. Lazy abstraction. *ACM SIGPLAN Notices,* 31(1):58-70, 2002.

[15] Orna Kupferman and Moshe Y. Vardi. Model checking of safety properties. *Formal Methods in System Design,* 19(3):291-314, 2001.

[16] Yassine Lachnech, Saddek Bensalem, Sergey Berezin, and Sam Owre. Incremental verification by abstraction. *LNCS,* 2031:98-112, 2001.

[17] M. O. Möller, H. Rueβ, and M. Sorea. Predicate abstraction for dense real-time systems. *Electronic Notes in Theoretical Computer Science,* 65(6), 2002.

[18] O. Möller and H. Rueβ. Solving bit-vector equations. *LNCS,* 1522:36-48, 1998.

[19] Matthew W. Moskewicz, Conor F. Madigan, Ying Zhao, Lintao Zhang, and Sharad Malik. Chaff: Engineering an Efficient SAT Solver. In *Proceedings of the 38th Design Automation Conference (DAC'01)*, June 2001.

[20] G. Nelson and D. C. Oppen. Simplification by cooperating decision procedures. *ACM Transactions on Programming Languages and Systems,* 1 (2):245-257, 1979.

[21] S. Owre, J. M. Rushby, and N. Shankar. PVS: A prototype verification system. In 11*th International Conference on Automated Deduction (CADE)*, volume 607 of *Lecture Notes in Artificial Intelligence*, pages 748-752. Springer-Verlag, 1992.

[22] David A. Plaisted and Steven Greenbaum. A structure preserving clause form translation. *Journal of Symbolic Computation,* 2(3):293-304, September 1986.

[23] A. Pnueli, Y. Rodeh, O. Shtrichman, and M. Siegel. Deciding equality formulas by small domains instantiations. *LNCS,* 1633:455-469, 1999.

[24] H. Rueβ and N. Shankar. Deconstructing Shostak. In 16*th Symposium on Logic in Computer Science (LICS* 2001). IEEE Press, June 2001.

[25] Vlad Rusu and Eli Singerman. On proving safety properties by integrating static analysis, theorem proving and abstraction. *LNCS,* 1579:178-192, 1999.

[26] H. Saïdi. Modular and incremental analysis of concurrent software systems. In 14*th IEEE International Conference on Automated Software Engineering*, pages 92-101. IEEE Computer Society Press, 1999.

[27] Robert Shostak. Deciding linear inequalities by computing loop residues. *Journal of the ACM,* 28(4):769-779, October 1981.

[28] A. P. Sistla. Safety, liveness and fairness in temporal logic. *Formal Aspects of Computing,* 6(5):495-512, 1994.

Model checking decides the problem of whether a system satisfies a temporal logic property by exploring the underlying state space. It applies primarily to finite-state systems but also to certain infinite-state systems, and the state space can be represented in symbolic or explicit form. Symbolic model checking has traditionally employed a Boolean representation of state sets using binary decision diagrams (BDD) [4] as a way of checking temporal properties, whereas explicit-state model checkers enumerate the set of reachable states of the system.

Recently, the use of Boolean satisfiability (SAT) solvers for linear-time temporal logic (LTL) properties has been explored through a technique known as bounded model checking (BMC) [7]. As with symbolic model checking, the state is encoded in terms of booleans. The program is unrolled a bounded number of steps for some bound k, and an LTL property is checked for counterexamples over computations of length k. For example, to check whether a program with initial state I and next-state relation T violates the invariant Inv in the first k steps, one checks, using a SAT solver:

$$I(s_0) \wedge T(s_0, s_1) \wedge \ldots \wedge T(s_{k-1}, s_k) \wedge (\neg Inv(s_0) \vee \ldots \vee \neg Inv(s_k))$$

This formula is satisfiable if and only if there exists a path of length at most k from the initial state $s_0$, which violates the invariant Inv. For finite state systems, BMC can be seen as a complete procedure since the size of counterexamples is essentially bounded by the diameter of the system [3]. It has been demonstrated that BMC can be more effective in falsifying hypotheses than traditional model checking [7, 8].

It is possible to extend the range of BMC to infinite-state systems by encoding the search for a counterexample as a satisfiability problem for the logic of Boolean constraint formulas. For example, the BMC problem for timed automata can be captured in terms of a Boolean formula with linear arithmetic constraints. But the method presented here scales well beyond such simple arithmetic clauses, since the main requirement on any given constraint theory is the decidability of the satisfiability problem on conjunctions of atomic constraints. Possible constraint theories include, for example, linear arithmetic, bitvectors, arrays, regular expressions, equalities over terms with uninterpreted function symbols, and combinations thereof [20, 24].

Whereas BMC over finite-state systems deals with finding satisfying Boolean assignments, its generalization to infinite-state systems is concerned with satisfiability of Boolean constraint formulas. There has been much recent work in reducing the satisfiability problem of Boolean formulas over the theory of equality with uninterpreted function symbols to a SAT problem [5, 12, 23] using eager encodings of possible instances of equality axioms. Barrett, Dill, and Stump [2] describe an integration of Chaff with CVC by abstracting the Boolean constraint formula to a propositional approximation, then incrementally refining the approximation based on diagnosing conflicts using theorem proving, and finally adding the appropriate conflict clause to the propositional approximation. This integration corresponds directly to an online integration in the lazy theorem proving paradigm. Their approach to generate good explanations is to extend CVC with a capability of abstract proofs for overapproximating minimal sets of inconsistencies. Also, optimizations based on don't cares are not considered in [2].

Initial experiments with PVS [21] strategies, based on a combination of BDDs for propositional reasoning and a variant of loop residue [27] for arithmetic, it was only possible to construct counterexamples of small depths (≦5). More specialized verification techniques are needed. Because BMC problems are often propositionally intensive, it seems to be more effective to augment SAT solvers with theorem proving capabilities, such as ICS [10], than add propositional search capabilities to theorem provers.

SUMMARY OF THE INVENTION

The inventive method for deciding the satisfiability of a formula teaches generating a candidate assignment for the variables in the formula; checking the validity of the candidate assignment; if the candidate assignment is valid, the formula is satisfiable; and where the assignment is not valid, the method provides generating a further candidate assignment for checking. Such further candidate assignment is different from the prior candidate assignment; when no further candidate assignment exists; the formula is unsatisfiable.

In alternate embodiments, the method includes abstracting the formula.

The method also includes checking the validity of the candidate assignment using a decision procedure, and instances where the candidate assignment for the variables in the abstract formula includes "don't care" values. A Boolean analogue of the candidate assignment is used constrain the generation of the further candidate assignment. The Boolean analogue is generated from an over approximation of the terms of the candidate assignment. Generating a candidate assignment is synchronized with checking the validity of such candidate assignment by extending a logical context of the checking means. The formula may contain variables with non-finite domains.

Deciding that the formula is unsatisfiable includes generating a counterexample showing why the formula is unsatisfiable. Generating a candidate assignment includes generating a partial candidate assignment for validity checking before generating a complete candidate assignment. Moreover, generating a further candidate assignment generates a partial further candidate assignment for validity checking before generating a complete further candidate assignment.

The invention provides bounded model checking of a program with respect to a property of interest comprising unfolding the program for a number of steps to create a program formula; translating the property of interest into an automaton; encoding the transition system of the automaton into a Boolean formula creating a transition formula; conjoining the program formula with the transition formula to create a conjoined formula; and deciding the satisfiability of the conjoined formula.

The automaton is a Büchi automaton in the preferred embodiment; the program contains variables with non-finite domain, and the property of interest contains constraints over non-finite domains. The property of interest is expressed using LTL in an alternate embodiment and may be the negation of a second property of interest. The program is the result of applying a k-induction rule to a second program, such that if the property of interest is not satisfiable then the second property of interest is proved to hold for the second program.

The program is a description of a system selected from the group consisting of electronic circuits, computer architectures, nanoelectronic architectures, biological models, control systems, algorithms and computer programs.

The property of interest is the unreachability of a particular state of the program.

The counterexample is used as a test case for testing the program.

BRIEF DESCRIPTION OF THE DRAWINGS

FIG. 1 depicts a lazy theorem proving algorithm for Bool (C).

DETAILED DESCRIPTION OF THE INVENTION

Figure 7:
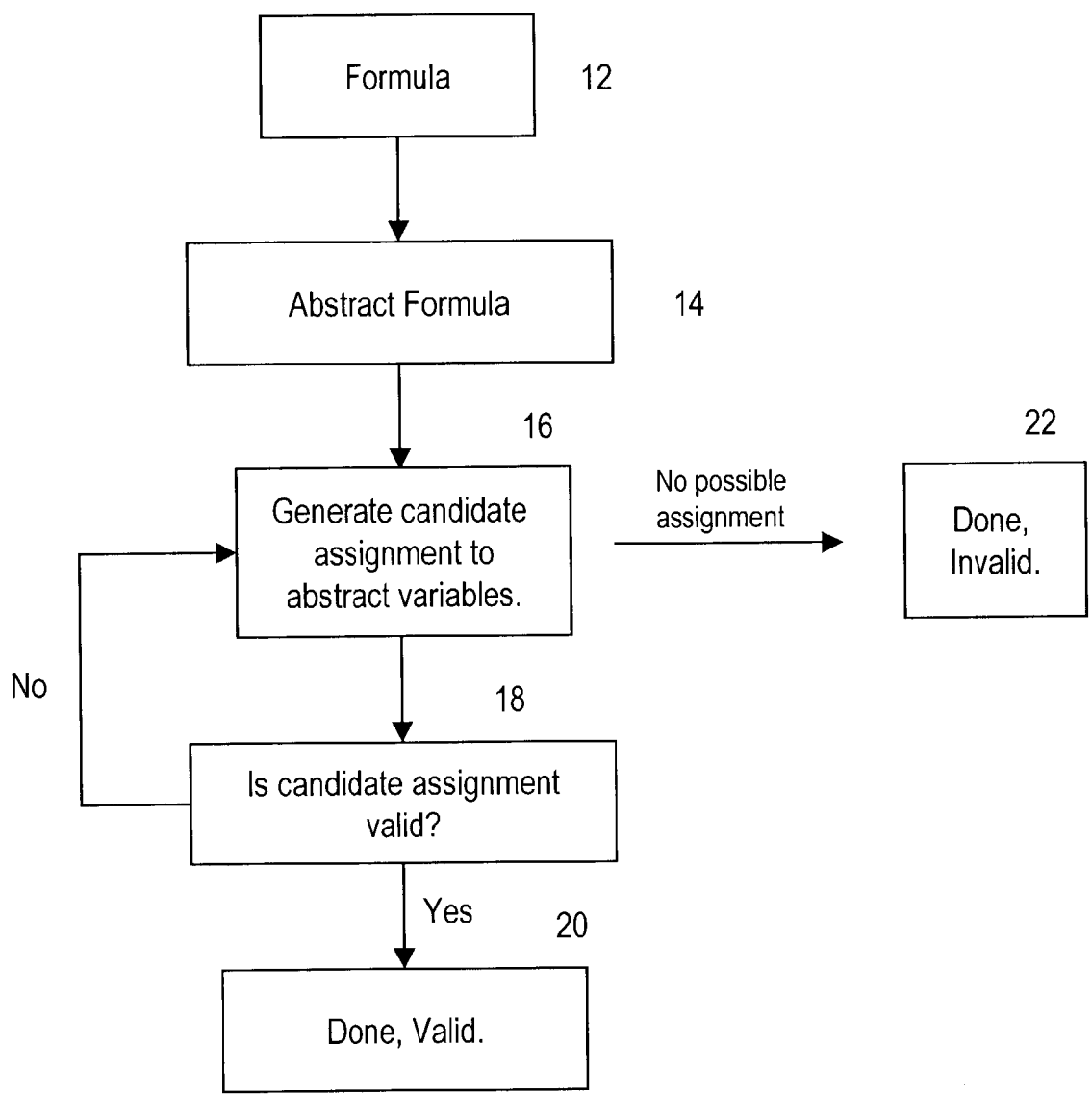
FIG. 7 illustrates a method according to the preferred embodiment.

As can be seen by referring to FIG. 7, the invention provides a method for deciding the satisfiability of a formula, starting at step 12 by providing a formula to be decided and ending at either step 20 or step 22. The method according to the invention advantageously allows for deciding satisfiability of formulas where the formula contains variables with non-finite domains.

In some embodiments of the invention, a step 14 of abstracting the formula is first performed creating an abstracted formula upon which the remainder of the computation is performed.

Step 16 comprises generating a candidate assignment for the variables in the formula. In one preferred embodiment, the candidate assignment generated for the variables in the abstract formula includes "don't care" values representing constraints that are not relevant to satisfiability. The step 16 of generating a candidate assignment is preferentially synchronized with the step 18 of checking the validity of the candidate assignment, by extending a logical context of the checking means. The step 16 of generating a candidate assignment further includes, in preferred embodiments, generating a partial candidate assignment for validity checking before generating a complete candidate assignment.

Step 18 comprises checking the validity of the candidate assignment. In the preferred embodiment, checking the validity of candidate assignment is performed using a decision procedure. If the candidate assignment is valid the method completes at step 20, by deciding that the formula is satisfiable.

Where the candidate assignment is determined to be not valid in step 18, processing continues by returning to step 16 and generating a further candidate assignment for checking, wherein the further candidate assignment is different from the candidate assignment. In the preferred embodiment, the step of generating a further candidate assignment, in such subsequent invocations of step 16, uses a Boolean analogue of the earlier candidate assignment generated in the first invocation of step 16 to constrain the generation of the further candidate assignment. The Boolean analogue used in such embodiments of step 16 is preferentially generated from an over approximation of the terms of said candidate assignment. As with the first invocation of step 16, the subsequent invocations of step 16 of generating a further candidate assignment is preferentially synchronized with the step 18 of checking the validity of further candidate assignment by extending a logical context of the checking means. Further, the subsequent invocations of step 16 of generating a further candidate assignment includes, in preferred embodiments, generating a partial further candidate assignment for validity checking before generating a complete further candidate assignment.

When no further candidate assignment exists in step 16, the method completes at step 22 by deciding that the formula is unsatisfiable. In the preferred embodiment, the step 22 of deciding that the formula is unsatisfiable further includes generating a counterexample, showing why the formula is unsatisfiable.

Figure 8:
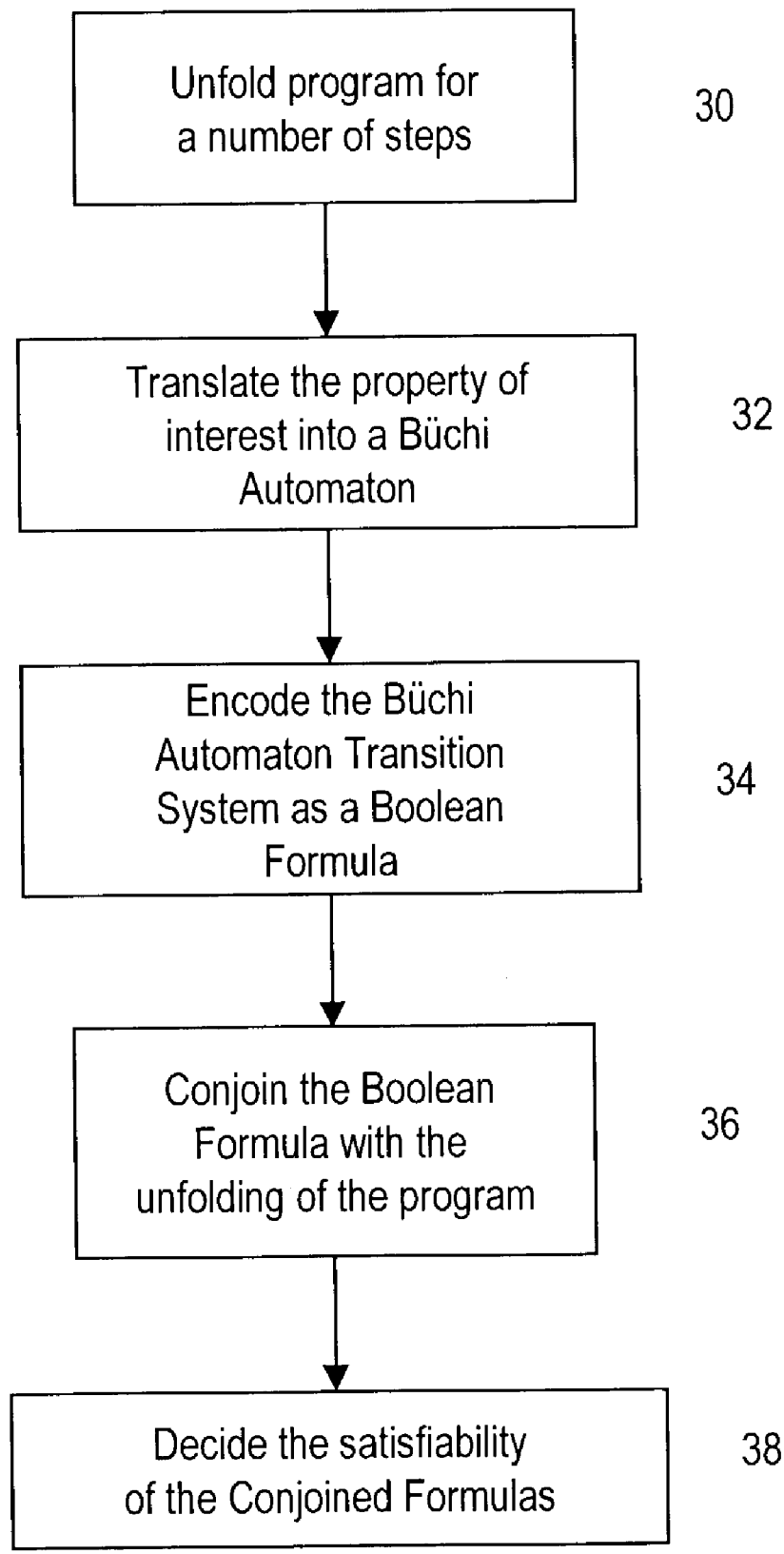
FIG. 8 illustrates a method according to the preferred embodiment.

Referring to FIG. 8, a method for performing bounded model checking of a program with respect to a property of interest is shown, starting at step 30 and continuing to step 38. The method according to the invention advantageously allows for deciding satisfiability of formulas where the program contains variables with non-finite domains and additionally where the property of interest contains constraints over non-finite domains. In preferred embodiments, the property of interest is expressed using LTL (linear temporal logic).

Step 30 comprises unfolding the program for a number of steps to create a program formula.

Step 32 comprises translating the property of interest into an automaton. In preferred embodiments, the automaton generated in step 32 is a Büchi automaton.

Step 34 comprises encoding the transition system of the automaton into a Boolean formula creating a transition formula.

Step 36 comprises conjoining the program formula with the transition formula to create a conjoined formula.

The method completes at step 38 by deciding the satisfiability of the conjoined formula. In preferred embodiments, the step 38 of deciding the satisfiabiltiy of the conjoined formula further includes generating a counterexample when the conjoined formula is unsatisfiable. The program analyzed by the invention is a description of a system of electronic circuits, computer architectures, nanoelectronic architectures, biological models, control systems, algorithms and computer programs.

Again referring to FIG. 8, the property of interest is the negation of a second property of interest and the program is the result of applying a k-induction rule to a second program, such that if the property of interest is not satisfiable then the second property of interest is proved to hold of the second program. In this way, bounded model checking is extended to provide full model checking.

In one embodiment of the invention, the property of interest is the unreachability of a particular state of the program and any counterexample generated provides a trace of how to reach that state. The generated counterexample is used as a test case for testing the program, providing the input to force the program to the state to be tested.

A bounded model checking (BMC) procedure for infinite-state systems and linear temporal logic formulas with constraints based on a reduction to the satisfiability problem of Boolean constraint logic is shown to be sound, and is complete for invariant formulas. Because BMC problems are propositionally intensive, the verification technique of the invention, based on a lazy combination of a SAT solver with a constraint solver, introduces only the portion of the semantics of constraints that is relevant for constructing a BMC counterexample.

Deciding the satisfiabiltiy of the conjoined formula further includes generating a counterexample when the conjoined formula is unsatisfiable.

A number of concepts are necessary for obtaining efficient implementations of lazy theorem proving. The first is to generate partial Boolean assignments based on the structure of program for restricting the search space of the SAT solver. Second, good approximations of minimal inconsistent sets of constraints at reasonable cost are essential. The disclosed any-time algorithm uses a mixture of structural dependencies between constraints and a linear number of reruns of the decision procedure for refining overapproximations. Third, offline integration and restarting the SAT solver results in repetitive work for the decision procedures. Based on these observations, the invention (in one embodiment) uses a lazy, online integration in which the construction of partial assignments in the Boolean domain is synchronized with the construction of a corresponding logical context for the constraint solver, and inconsistencies detected by the constraint solver are immediately propagated to the Boolean domain. Many standard engineering techniques can be applied to significantly improve running times.

Possible applications of the invention are legion. Given the rich set of possible constraints, including constraints over uninterpreted function symbols, for example, the extended BMC methods of the invention are suitable for model checking open systems, where environments are only partially specified. Also, BMC based on lazy theorem proving can be advantageously used as an alternative to specialized model checking algorithms such as the ones for timed automata and extensions thereof for finding bugs, or even to AI planners dealing with resource constraints and domain-specific modeling.

The invention, in one aspect, is directed to the specific combination of SAT solvers with decision procedures, and a method that we call lemmas on demand, which invokes the theorem prover lazily in order to efficiently prune out spurious counterexamples, namely, counterexamples that are generated by the SAT solver but discarded by the theorem prover by interpreting the propositional atoms. For example, the SAT solver might yield the satisfying assignment p, ⊆q, where the propositional variable p represents the atom x=y, and q represents f(x)=f(y). A decision procedure can easily detect the inconsistency in this assignment. More importantly, it can be used to generate a set of conflicting assignments that can be used to construct a lemma that further constrains the search. In the above example, the lemma p∨q can be added as a new clause in the input to the SAT solver. This process of refining Boolean formulas is similar in spirit to the refinement of abstractions based on the analysis of spurious counterexamples or failed proof [26, 25, 6, 16, 9, 14, 17].

From a set of inconsistent constraints in a spurious counterexample the invention can provide an explanation as an overapproximation of the minimal, inconsistent subset of these constraints. The smaller the explanation that is generated from a spurious counterexample, the greater the pruning in the subsequent search. In this way, the computation of explanations accelerates the convergence of the procedure.

Altogether, this method for bounded model checking over infinite-state systems provides a reduction to the satisfiability problem for Boolean constraint formulas; a lazy combination of SAT solving and theorem proving; and an efficient method for constructing small explanations.

In general, BMC over infinite-state systems is not complete, but the invention obtains a completeness result for BMC problems with invariant properties. The main condition on constraints is that the satisfiability of the conjunction of constraints is decidable. Thus, the BMC procedure can be applied to infinite-state systems even when the more general model-checking problem is undecidable.

Lazy theorem proving introduces the semantics of the formula constraints on demand by analyzing spurious counterexamples. Also, the procedure works uniformly for much richer sets of constraint theories.

Boolean Constraints

A set of variables $V:=\{x_1, \ldots x_n\}$ is said to be typed if there are nonempty sets $D_1$, through $D_n$, and a type assignment $\tau$ such that $\tau(x_i)=Di$. For a set of typed variables V, a variable assignment is a function v from variables $x \in V$ to an element of $\tau(x)$.

Let V be a set of typed variables and L be an associated logical language. A set of constraints in L is called a constraint theory C if it includes constants true, false and if it is closed under negation; a subset of C, of constraints with free variables in $V' \Rightarrow V$ is denoted by C(V'). For $c \in C$ and v, an assignment for the free variables in c, the value of the predicate $\|c\|_v$, is called the interpretation of c with respect to v. Hereby, $\|true\|_v (\|false\|_v)$ is assumed to hold for all (for no) v, and $\|\neg c\|_v$ holds if and only if $\|c\|_v$ does not hold. A set of constraints $C' \Rightarrow C$ is said to be satisfiable if there exists a variable assignment v such that $\|c\|_v$ holds for every c in C'; otherwise, C' is said to be unsatisfiable. Furthermore, a function C-sat(C') is called a C-satisfiability solver if it returns ⊥ if the set of constraints C' is unsatisfiable and a satisfying assignment for C' otherwise.

For a given theory C, the set of boolean constraints Bool(C) includes all constraints in C and it is closed under conjunction ∧, disjunction ∧, and negation ¬. The notions of satisfiability, inconsistency, satisfying assignment, and satisfiability solver are homomorphically lifted to the set of Boolean constraints in the usual way. If $V=\{p_1, \ldots, p_n\}$ and the corresponding type assignment $\tau(p_i)$ is either true or false, then Bool({true, false} ∪V) reduces to the usual notion of Boolean logic with propositional variables $(p_1, \ldots, p_n$. We call a Boolean satisfiability solver also a SAT solver. N-ary disjunctions of constraints are also referred to as clauses, and a formula $\phi \in$ Bool (C(V)) is in conjunctive normal form (CNF) if it is an n-ary conjunction of clauses. There is a linear-time satisfiability-preserving transformation into CNF [22].

Lazy Theorem Proving

Satisfiability solvers for propositional constraint formulas can be obtained from the combination of a propositional SAT solver with decision procedures simply by converting the problem into disjunctive normal form, but the result of such naïve combinations is prohibitively expensive. The invention, in one aspect, provides a lazy combination of SAT solvers with constraint solvers based on an incremental refinement of Boolean formulas. The description provided herein is given in terms of formulas in CNF, since most modern SAT solvers expect their input to be in this format, although it will be apparent to those skilled in the art that alternative formats may be used within the scope of the invention.

Translation schemes between propositional formulas and Boolean constraint formulas are needed. Given a formula $\phi$ such a correspondence is easily obtained by abstracting constraints in $\phi$ with (fresh) propositional variables. More formally, for a formula $\phi \in$ Bool(C) with atoms $C'=\{c_1, \ldots, c_n\} \in C$ and a set of propositional variables $P=\{p_1, \ldots, p_n\}$ not occurring in V, the mapping $\alpha$ from Boolean formulas over $\{c_1, \ldots, c_n\}$, to Boolean formulas over P is defined as the homomorphism induced by $\alpha(c_i)=p_i$. The inverse $\gamma$ of such an abstraction mapping $\alpha$ simply replaces propositional variables $p_i$ with their associated constraints $c_i$. For example, the formula $\phi \equiv f(x) \neq x \wedge f(f(x))=x$ over equalities of terms with uninterpreted function symbols determines the function $\alpha$ with, say, $\alpha(f(x) \neq x)=p_1$ and $\alpha(f(f(x))=x)=p_2$; thus $\alpha(\phi)=p_1 \wedge p_2$. Moreover, a Boolean assignment v: P→{true, false} induces a set of constraints $\gamma(v) \equiv \{c \in C | \exists i.$ if $v(p_i=$true then $c=\gamma(p_i)$ else $c=\neg\gamma(p_i)\}$.

Now, given a Boolean variable assignment v such that $v(p_1)$ false and $V(p_2)$ true, $\gamma(v)$ is the set of constraints $\{f(f(x))=x, f(f(x))=x\}$. A consistent set of constraints C' determines a set of assignments. For choosing an arbitrary, but fixed assignment from this set, we assume as given a function choose (C').

Theorem 1. Let a Bool(C) be a formula in CNF, $\lambda$ be the literals in $\alpha(\phi)$, and $I(\phi):=\{L \Rightarrow \lambda / \gamma$ (L) is C-inconsistent} be the set of C-inconsistencies for $\phi$; then: $\phi$ is C-satisfiable if the following Boolean formula is satisfiable:

$$\alpha(\varphi) \wedge \left( \bigwedge_{\{l_1, \ldots, l_n\} \in I(\varphi)} (\neg l_1 \vee \ldots \vee \neg l_n) \right).$$

sat($\phi$)
   p:=$\alpha(\phi)$;
   loop v:=B-sat(p);
if v=⊥ then return ⊥;
if C-sat(γ(v))≠⊥ then return choose(γ(v));

$$I := \bigvee_{c \in y(v)} \neg \alpha(c); p := p \wedge I$$

endloop

FIG. 1. Lazy Theorem Proving for Bool(C).

Thus, every Bool(C) formula can be transformed into an equisatisfiable Boolean formula as long as the consistency problem for sets of constraints in C is decidable. This transformation enables one to use off-the-shelf satisfiability checkers to determine the satisfiability of Boolean constraint formulas. On the other hand, the set of literals is exponential in the number of variables and, therefore, an exponential number of C-inconsistency checks is required in the worst case. It has been observed, however, that in many cases only small fragments of the set of C-inconsistencies are needed.

Starting with p=α(φ), the procedure sat(φ) in FIG. 1 realizes a guided enumeration of the set of C-inconsistencies. In each loop, the SAT solver B-sat suggests a candidate assignment v for the Boolean formula p, and the satisfiability solver C-sat for C checks whether the corresponding set of constraints (v) is consistent. Whenever this consistency check fails, p is refined by adding a Boolean analogue I of this inconsistency, and B-sat is applied to suggest a new candidate assignment for the refined formula p∧I. This procedure terminates, since, in every loop, I is not subsumed by p, and there are only a finite number of such strengthenings.

Corollary 1. sat(φ) in FIG. 1 is a satisfiability solver for Bool(C) formulas in CNF.

We now list some useful optimizations, employed in preferred embodiments of the invention. If the variable assignments returned by the SAT solver are partial in that they include don't care values, then the number of argument constraints to C-sat can usually be reduced considerably. The use of don't care values also speeds up convergence, since more general lemmas are generated. Now, assume a function explain(C), which, for an inconsistent set of constraints C, returns a minimal number of inconsistent constraints in C or a "good" overapproximation thereof. The use of explain(C) instead of the stronger C obviously accelerates the procedure.

Infinite-State BMC

Given a BMC problem for an infinite-state program, an LTL formula with constraints, and a bound on the length of counterexamples to be searched for, the invention, in one aspect, provides a sound reduction to the satisfiability problem of Boolean constraint formulas, that is complete for invariant properties. The encoding of transition relations follows the now-standard approach already taken in [13]. Whereas in [7] LTL formulas are translated directly into propositional formulas, we use Büchi automata for this encoding. This simplifies substantially the notations and the proofs, but a direct translation can sometimes be more succinct in the number of variables needed. We use the common notions for finite automata over finite and infinite words, and we assume as given a constraint theory C with satisfiability solver.

Typed variables in V:={$x_i$, . . . , $x_n$,} are also called state variables, and a program state is a variable assignment over V. A pair (I, T) is a C-program over V if I∈Bool(C(V)) and T∈Bool(C(V∪V')), where V' is a primed, disjoint copy of V. I is used to restrict the set of initial program states, and T specifies the transition relation between states and their successor states. The set of C-programs over V is denoted by Prg(C(V)). The semantics of a program P is given in terms of a transition system M in the usual way, and, by a slight abuse of notation, we sometimes write M for both the program and its associated transition system. The system depicted in FIG. 2, for example, is expressed in terms of the program (I, T) over {x,l}, where the counter x is interpreted over the integers and the variable I for encoding locations is interpreted over the Booleans (the n-ary connective ⓧ can be implemented as either "or" (disjunction) or exclusive -or).

$$I(x, l) := x \geq 0 \wedge l$$

$$T(x, l, x', l') := (l \wedge x' = x + m \wedge \neg l') \otimes$$
$$(\neg l \wedge x \geq 0 \wedge x' = x - m - 1 \wedge \neg l') \otimes (\neg l \wedge x' = x \wedge l')$$

Figure 2:
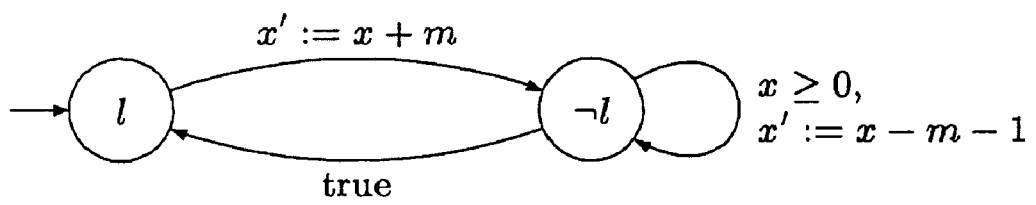
FIG. 2 represents a simple example.

Initially, the program is in location l and x is greater than or equal to 0, and the transitions in FIG. 2 are encoded by a conjunction of constraints over the current state variables x, l and the next state variables x', l'.

The formulas of the constraint linear temporal logic LTL (C) (in negation normal form) are linear-time temporal logic formulas with the usual "next", "until", and "release", operators, and constraints c∈C as atoms.

$$\phi ::= \text{true} | \text{false} | c | \phi_1 \wedge \phi_2 | X\phi | \phi_1 U \phi_2 | \phi_1 R \phi_2$$

The formula Xφ holds on some path π if φ holds in the second state of π. $p_1 U \phi_2$ holds on π if there is a state on the path where $\phi_2$ holds, and at every preceding state on the path $\phi_1$ holds. The release operator R is the logical dual of U. It requires that $\phi_2$ holds along the path up to and including the first state, where $\phi_1$ holds. However, $\phi_1$ is not required to hold eventually. The derived operators Fφ=true Uφ and Gφ=false Rφ denote "eventually φ" and "globally φ". Given a program M∈Prg(C') and a path π in M, the satisfiability relation M, π|=φ for an LTL(C) formula φ is given in the usual way with the notable exception of the case of constraint formulas c. In this case, M, π|>c if and only if c holds in the start state of π. Assuming the notation above, the C-model checking problem Mπ|=φ holds if for all paths π=$s_0$, $s_1$, . . . in M with $S_0$∈I it is the case that M, π|=φ. Given a bound k, a program M∈Prg(C) and a formula φ∈LTL(C) we now consider the problem of constructing a formula M, ||M,ρ||$_k$∈E Bool(C), which is satisfiable if and only if there is a counterexample of length k for the C-model checking problem M|φ. This construction proceeds as follows.

1. Definition of ||M||$_k$ as the unfolding of the program M up to step k from initial states (this requires k disjoint copies of V).

2. Translation of φ into a corresponding Büchi automaton $B_{r\phi}$ whose language of accepting words consists of the satisfying paths of φ.

3. Encoding of the transition system for $B_{r\phi}$, and the Büchi acceptance condition as a Boolean formula, say ||B||$_k$.

4. Forming the conjunction ||M,ρ||$_k$:=||B||$_k$∧||M||$_k$.

5. A satisfying assignment for the formula ||M,ρ||$_k$ induces a counterexample of length k for the model checking problem M|=φ.

Definition 1 (Encoding of C-Programs). The encoding ||M||$_k$ of the kth unfolding of a C-program M=(I, T) in Prg(C ({$x_1$, . . . , $x_2$, })) is given by the Bool(C) formula ||M||$_k$.

$$I_0(x[0]) := I\langle\{x_i \mapsto x_i[0] | x_i \in V\}\rangle$$

$$T_j(x[j], x[j+1]) := T\langle\{x_i \mapsto x_i[j] | x_i \in V\} \cup \{x_i' \mapsto x_i[j+1] | x_i \in V\}\rangle$$

$$\|M\|_k := I_0(x[0]) \wedge \bigwedge_{j=0}^{k-1} T_j(x[j], x[j+1])$$

where $\{x_i[j] 0 \leq j \leq k\}$ is a family of typed variables for encoding the state of variable $x_i$ in the jth step, $x[j]$ is used as an abbreviation for $x_1[f]m, \ldots, x_n[j]$, and $T T(x \Rightarrow x_i[j])$ denotes simultaneous substitution of $x_i$ by $x_i[j]$ in formula T.

A two-step unfolding of the simple program in FIG. 2 is encoded by insert $$\|\text{simple}\|_2 := I_0 \wedge T_0 \wedge T_1(*).$$

$$I_0 := (l[0] \geq 0 \wedge l[0])$$

$$T_0 := (l[0] \wedge (x[1] = x[0] + m) \wedge \neg l[1]) \otimes$$

$$(\neg l[0] \wedge (x[0] \geq 0) \wedge (x[1] = x[0] - m - 1) \wedge \neg l[1]) \otimes$$

$$(\neg l[0] \wedge (x[1] = x[0]) \wedge l[1])$$

$$T_1 := (l[1] \wedge (x[2] = x[1] + m) \wedge \neg l[2]) \otimes$$

$$(\neg l[1] \wedge (x[1] \geq 0) \wedge (x[2] = x[1] - m - 1) \wedge \neg l[2]) \otimes$$

$$(\neg l[1] \wedge (x[2] = x[1]) \wedge l[2])$$

The translation of linear temporal logic formulas into a corresponding Büchi automaton is well studied in the literature [11] and does not require additional explanation. Notice, however, that the translation of LTL(C) formulas yields Büchi automata with C-constraints as labels. Both the resulting transition system and the bounded acceptance test based on the detection of reachable cycles with at least one final state can easily be encoded as Bool(C) formulas.

Definition 2 (Encoding of Büchi Automata). Let $V = \{x_1, \ldots, x_2\}$ be a set of typed variables, $B = (\Sigma, Q, \Delta, Q^0, F)$ be a Büchi automaton with labels $\Sigma$ in Bool(C), and pc be a variable (not in V), which is interpreted over the finite set of locations Q of the Büchi automaton. For a given integer k, we obtain, as in Definition 1, families of variables $x_1[j]$, $pc[j]$ ($1 \leq i \leq n$, $0 \leq j \leq k$) for representing the jth state of B in a run of length k. Furthermore, the transition relation of B is encoded in terms of the C-program $B_M$ over the set of variables $\{pc\} \cup V$, and $\|B_M\|_k$ denotes the encoding of this program as in Definition 1. Now, given an encoding of the acceptance condition $$acc(B)_k := \bigvee_{j=0}^{k-1}\left(pc[k] = pc[j] \wedge \bigwedge_{v=1}^{n} x_v[k] = x_v'[j] \wedge \left(\bigvee_{l=j+1}^{k} \bigvee_{f \in F} pc[l] = f\right)\right)$$

the k-th unfolding of B is defined by $\|B\|_k := \|B_M\|_k \wedge acc(B)_k$.

An LTL(C) formula is said to be R-free (U-free) if there is an equivalent formula (in negation normal form) not containing the operator R (U). Note that U-free formulas correspond to the notion of syntactic safety formulas [28, 15]. Now, it can be directly observed from the semantics of LTL(C) formulas that every R-free formula can be translated into an automaton over finite words that accepts a prefix of all infinite paths satisfying the given formula.

Definition 3. Given an automaton B over finite words and the notation as in Definition 2, the encoding of the k-ary unfolding of B is given by $\|B_M\|_k \wedge acc(B)_k$ (B) k with the acceptance condition $$acc(B)_k := \bigvee_{j=0}^{k} \bigvee_{f \in F} pc[j] = f.$$

Figure 3:
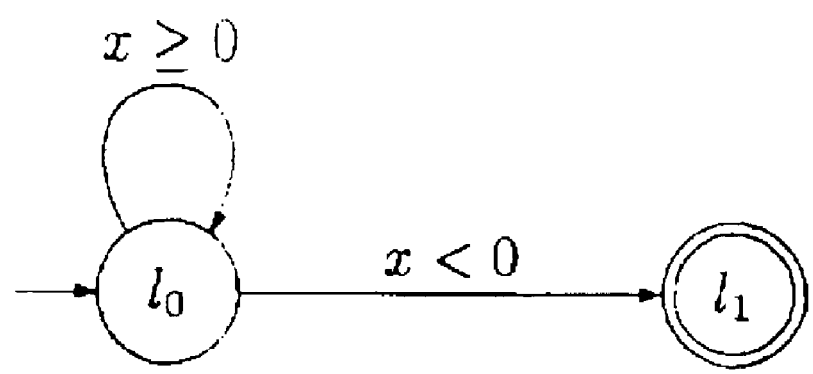
FIG. 3 depicts an automaton for F (x>0).

Consider the problem of finding a counterexample of length k=2 to the hypothesis that our running example in FIG. 2 satisfies G (x>0). The negated property F (x<0) is an R-free formula, and the corresponding automaton 8 over finite words is displayed in FIG. 3 ($l_1$ is an accepting state.). This automaton is translated, according to Definition 3, into the formula $$\|B\|_2 = I(B) \wedge T_0(B) \wedge T_1(B) \wedge acc(B)_2. \tag{**}$$

The variables p[j] and [j] (j=0, 1, 2) are used to represent the first three states in a run.

$$I(B) := pc[0] = l_0$$
$$T_0(B) := (pc[0] = l_0 \wedge x[0] \geq 0 \wedge pc[1] = l_0) \otimes (pc[0] = l_0 \wedge x[0] < 0 \wedge pc[1] = l_1)$$
$$T_1(B) := (pc[1] = l_0 \wedge x[1] \geq 0 \wedge pc[2] = l_0) \otimes (pc[1] = l_0 \wedge x[1] < 0 \wedge pc[2] = l_1)$$
$$acc(B)_2 := pc[0] = l_1 \vee pc[1] = l_1 \vee pc[2] = l_1$$

The bounded model checking problem $\|\text{simple}\|_2 \wedge \|B\|_2$ for the simple program is obtained by conjoining the formulas (*) and (**). Altogether, we obtain the counterexample $(0, 1) \to (m, 1) \to (-1, 1)$ of length 2 for the property G ($x \geq 0$).

Theorem 2 (Soundness). Let $M \in Prg(C)$ and $\in$ LTL(C). If there exists a natural number k such that $\|M, \phi\|_k$ is satisfiable, then $M \models \phi$.

Proof sketch. If $\|M, \phi\|_k$ is satisfiable, then so are $\|B\|_k$ and $\|M\|_k$. From the satisfiability of $\|B\|_k$ it follows that there exists a path in the Büchi automaton B that accepts the negation of the formula $\phi$.

In general, BMC over infinite-state systems is not complete. Consider, for example, the model checking problem $M \models \phi$ for the program $M = \{I, T\}$ over the variable $V = \{x\}$ with $I = (x=0)$ and $T = (x'=x+1)$ and the formula $\phi = F$ (x<0). M can be seen as a one-counter automaton, where initially the value of the counter x is 0, and in every transition the value of x is incremented by 1. Obviously, it is the case that $M \not\models \phi$, but there exists no $k \in \mathbb{N}$ such that the formula $\|M, \phi\|_k$ is satisfiable. Since $\phi$ is not an R-free formula, the encoding of the Büchi automaton $B_k$ must contain, by Definition 2, a finite accepting cycle, described by $pc[k]=pc[0] \wedge x[k]=x[0]$ or $pc[k]=pc[1] \wedge x[k]=x[1]$ etc. Such a cycle, however, does not exist, since the program M contains only one noncycling, infinite path, where the value of x increases in every step, that is x[i+1]=x[i]+1, for all i≧0.

Theorem 3 (Completeness for Finite States). Let M be a C-program with a finite set of reachable states, φ be an LTL (C) formula φ, and k be a given bound; then: M⊨≠φ: implies ∃k∈IN, $\|M,\phi\|_k$ is satisfiable.

Proof sketch. If M⊨≠φ, then there is a path in M that falsifies the formula. Since the set of reachable states is finite, there is a finite k such that $\|M,\phi\|_k$ is satisfiable by construction.

For a U-free formula φ, the negation φ is R-free and can be encoded in terms of an automaton over finite words. Therefore, by considering only U-free properties one gets completeness also for programs with an infinite set of reachable states. A particularly interesting class of U-free formulas are invariant properties.

Theorem 4 (Completeness for Syntactic Safety Formulas). Let M be a C-program, φ∈LTL(C) be a U-free property, and k be some given integer bound. Then M⊨≠φ implies ∃k∈IN, $\|M,\phi\|_k$ is satisfiable.

Proof sketch. If M⊨≠φ and φ is U-free then there is a finite prefix of a path of M that falsifies φ. Thus, by construction of $\|M,\phi\|_k$ there is a finite k such that $\|M,\phi\|_k$ is satisfiable.

This completeness result can easily be generalized to all safety properties [15] by observing that the prefixes violated by these properties can also be accepted by an automaton on finite words.

EXAMPLES

We demonstrate the BMC method of the invention using clock constraints and the theory of bitvectors by means of some simple but illustrative examples.

Figure 4:
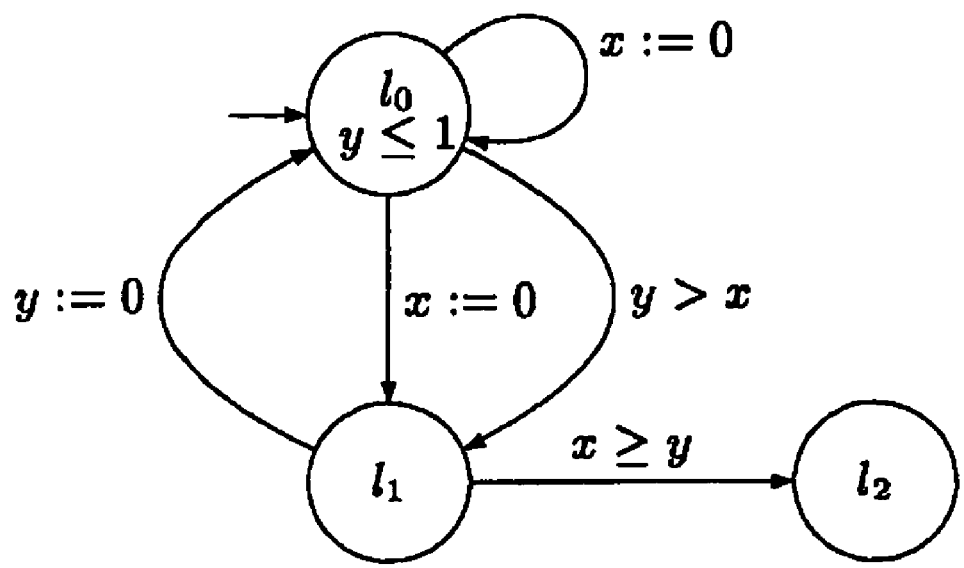
FIG. 4 illustrates a timed automata example.

The timed automaton [1] in FIG. 4 has two real-valued clocks x, y, the transitions are decorated with clock constraints and clock resets, and the invariant y≦1 in location $l_0$ specifies that the system may stay in $l_0$ only as long as the value of y does not exceed 1. The transitions can easily be described in terms of a program with linear arithmetic constraints over states (pc, x, y), where pc is interpreted over the set of locations $\{l_0, l_1, l_2\}$ and the clock variables x, y are interpreted over $IR^+_0$. Here we show only the encoding of the time delay steps.

delay(pc, x, y, pc', x', y'):=∃δ≧0.((pc=$l_0$⇒ y'≦1)∧(x'=x+δ)∧(y'=y+δ)∧(pc'=pc)).

This relation can easily be transformed into an equivalent quantifier-free formula. Now, assume the goal of falsifying the hypothesis that the timed automaton in FIG. 4 satisfies the LTL(C) property φ=(G $l_2$), that is, the automaton never reaches location $l_2$. Using the BMC procedure over linear arithmetic constraints one finds the counterexample $(l_0,x=0,y=0) \to (l_1,x=0,y=0) \to (l_2,x=0,y=0)$ of length 2. By using Skolemization of the delay step δ instead of quantifier elimination, explicit constraints are synthesized for the corresponding delay steps in countertraces.

Now, we examine BMC over a theory B of bitvectors by encoding the shift register example in [3] as follows.

$I_{BS}(x_n):=true$ $T_{BS}(x_n, y_n):=(y_n=x_n[1:n-1]*1_1)$

The variables $x_n$, and $y_n$, are interpreted over bitvectors of length n, $x_n[1:n-1]$ denotes extraction of bits 1 through n−1, * denotes concatenation, and $0_n$ (1n) is the constant bitvector of length n with all bits set to zero (one). In the initial state the content of the register $x_n$, is arbitrary. Given the LTL(B) property φ=F ($x_n=0_n$) and k=2 the corresponding BMC problem reduces to showing satisfiability of the Bool(B) formula $(x_1=x_0[1:n-1]*1_1) \wedge (x_2=x_1[1:n-1]*1_1) \wedge (x_0 \neq 0_n \wedge x_0 \neq 0_n \wedge x_2 \cdot 0_n) \wedge (x_0=x_2 \wedge x_1=x_2))$ The variables $x_0$, $x_1$, $x_2$ are interpreted over bitvectors of size n, since they are used to represent the first three states in a run of the shift register. The satisfiability of this formula is established by choosing all unit literals to be true. Using theory-specific specific canonization (rewrite) steps for the bitvector theory B [18], we obtain an equation between variables $x_2$ and $x_0$.

$x_2=x_1[1:n-1]*1_1=(x_0[1:n-1]*1_1)[1:n-1]*1_1=x_1[2:n-1]*1_2$

This canonization step corresponds to a symbolic simulation of depth 2 of the synchronous circuit. Now, in case the SAT solver decides the equation $x_0=x_2$ to be true, the bitvector decision procedures are confronted with solving the equality $x_0=[2: n-1]*1_2$. The most general solution for $x_0$ is obtained using the solver in [18] and, by simple backsubstitution, one gets a satisfying assignment for $x_0$, $x_1$, $x_2$, which serves as a counterexample for the assertion that the shift register eventually is zero. The number of case splits is linear in the bound k, and, by leaving the word size uninterpreted, our procedure invalidates a family of shift registers without runtime penalties.

Efficiency Issues

Figure 5:
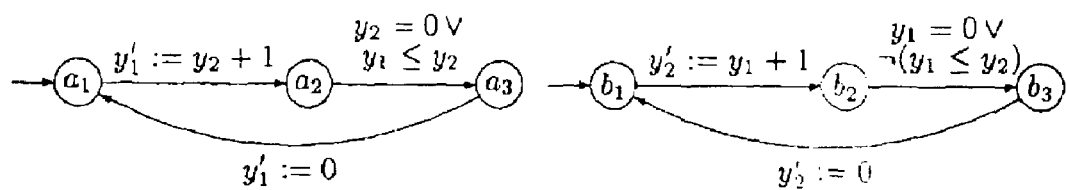
FIG. 5 provides a Bakery Mutual Exclusion Protocol.

This section identifies the useful concepts and techniques utilized in preferred embodiments of the invention. To illustrate these embodiments, we present results of experiments representing various embodiments of the lazy theorem proving algorithm according to the invention, using SAT solvers such as Chaff [19] and ICS [10] for deciding linear arithmetic constraints. These programs return ⊥ in case the input Boolean constraint problem is unsatisfiable, and otherwise an assignment for the variables. We describe some of our experiments using the Bakery mutual exclusion protocol (see FIG. 5). Usually, the $y_j$ counters are initialized with 0, but here we simultaneously consider a family of Bakery algorithms by relaxing the condition on initial values of the counters to $y_1 \geq 0 \wedge y_2 \geq 0$. Our experiments represent worst-case scenarios in that the corresponding BMC problems are all unsatisfiable. Thus, unsatisfiability of the BMC formula for a given k corresponds to a verification of the mutual exclusion property for paths of length ≦k.

Initial experiments with a direct implementation of the refinement algorithm in FIG. 1 clearly show that this approach quickly becomes impractical. We identified two main reasons for this inefficiency.

First, for the interleaving semantics of the Bakery processes, usually only a small subset of assignments is needed for establishing satisfiability. This can already be demonstrated using the simple example in FIG. 2. Suppose a satisfying assignment v (counterexample) corresponding to executing the transition l→⌐l with x=x+m in the first step; that is, $\|l[0]\|_v, \|x[1]=x[0]+m\|_v$, and $\|\neg l[1]\|_v$ hold. Clearly, the value of the literals x[0]≧0, x[1]=x[0]−m−1, and x[1]=x[0] are don't cares, since they are associated with some other transition. Overly eager assignment of truth values to these constraints results in useless search. For example, if $\|x[1]=x[0]\|$ holds, then an inconsistency is detected, since m>0, and x[1]=x[1]+m=x[0]. Consequently, the assignment v is discarded and the search continues. To remedy the situation we analyze the structure of the formula before converting it to CNF, and use this information to assign don't care values to literals corresponding to unfired transitions in each step.

Second, the convergence of the refinement process must be accelerated by finding concise overapproximations explain (C) of the minimal set of inconsistent constraints C corresponding to a given Boolean assignment. There is an obvious trade-off between the conciseness of this approximation and the cost for computing it. We are proposing an algorithm for finding such an overapproximation based on rerunning the decision procedures O(m×n) times, where m is some given upper bound on the number of iterations (see below) and n is the number of given constraints.

Figure 6:
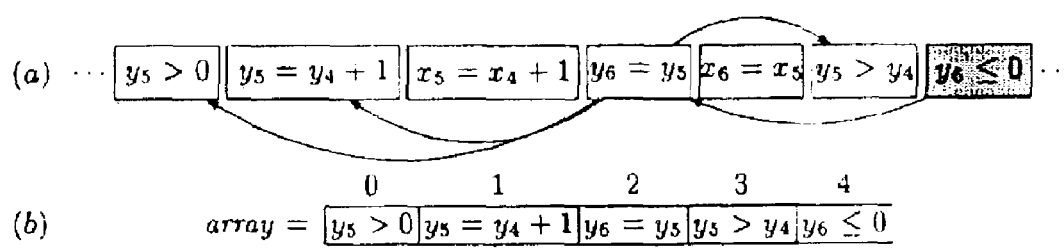
FIG. 6 illustrates a trace for linear time explain function.

The run in FIG. 6 illustrates this procedure. The constraints in FIG. 6(a) are asserted to ICS from left-to-right. Since ICS detects a conflict when asserting $y_6 \leq 0$, this constraint is in the minimal inconsistent set. Now, an overapproximation of the minimal inconsistent sets is produced by connecting constraints with common variables (FIG. 6.(a)). This overapproximation is iteratively refined by collecting the constraints in an array as illustrated in FIG. 6.(b). Configurations consist of triples (C, l, h), where C is a set of constraints guaranteed to be in the minimal inconsistent set, and the integers l, h are the lower and upper bounds of constraint indices still under consideration. The initial configuration in our example is ($\{Y_6 \leq 0\}$, 0, 3). In each refinement step, we maintain the invariant that $C \cup \{array[i] | l \leq i \leq h\}$ is inconsistent. Given a configuration (C, l, h), individual constraints of index between l and h are added to C until an inconsistency is detected. In the first iteration of our running example, we process constraints from right-to-left, and an inconsistency is only detected when processing $y_5 > 0$. The new configuration ($\{y_6 \leq 0, y_5 > 0\}$,1,3) is obtained by adding this constraint to the set of constraints already known to be in a minimal inconsistent set, by leaving h unchanged, and by setting l to the increment of the index of the new constraint. The order in which constraints are asserted is inverted after each iteration. Thus, in the next step in our example, we successively add constraints between 1 and 3 from left-to-right to the set $\{y_6 \leq 0, y_5 > 0\}$. An inconsistency is first detected when asserting $y_6 = y_5$ to this set, and the new configuration is obtained as ($\{y_6 \leq 0, y_5 > 0, y_6 y_5\}$,1,1), since the lower bound l is now left unchanged and the upper bound is set to the decrement of the index of the constraint for which the inconsistency has been detected. The procedure terminates if C in the current configuration is inconsistent or after m refinements. In our example, two refinement steps yield the minimal inconsistent set $\{y_5 > 0, y_6, y_5, y_6 \leq 0\}$. In general, the number of assertions is linear in the number of constraints, and the algorithm returns the exact minimal set if its cardinality is less than or equal to the upper bound m of iterations.

Given these refinements to the satisfiability algorithm in FIG. 1, we implemented an offline integration of Chaff with ICS, in which the SAT solver and the decision procedures are treated as black boxes, and both procedures are restarted in each lazy refinement step. Table 1 includes some statistics for three different configurations depending on whether don't care processing or the linear explain are enabled. For each configuration, we list the total time (in seconds) and the number of conflicts detected by the decision procedure. This table indicates that the effort of assigning don't care values depending on the asynchronous nature of the program and the use of explain functions significantly improves performance.

The experiments so far represent worst-case scenarios in that the given formulas are unsatisfiable. For BMC problems with counterexamples, however, our procedure usually converges much faster. Consider, for example the mutual exclusion problem of the Bakery protocol with a guard $y_1 > y_2 - 1$ instead of $\subseteq (y_1 \leq y_2)$. The corresponding counterexample for k=5 is produced

TABLE 1

Offline lazy theorem proving ('-' is time $\geq$ 1800 secs).

| | don't cares, no explain | | no don't cares, explain | | don't cares, explain | |
|---|---|---|---|---|---|---|
| depth | time | conflicts | time | conflicts | time | conflicts |
| 5 | 0.71 | 66 | 45.23 | 577 | 0.31 | 16 |
| 6 | 2.36 | 132 | 83.32 | 855 | 0.32 | 18 |
| 7 | 12.03 | 340 | 286.81 | 1405 | 1.75 | 58 |
| 8 | 56.65 | 710 | 627.90 | 1942 | 2.90 | 73 |
| 9 | 230.88 | 1297 | 1321.57 | 2566 | 8.00 | 105 |
| 10 | 985.12 | 2296 | — | — | 15.28 | 185 |
| 15 | — | — | — | — | 511.12 | 646 |

TABLE 2

Online lazy theorem proving.

| | no explain | | | explain | | |
|---|---|---|---|---|---|---|
| depth | time | conflicts | calls to ICS | time | conflicts | calls to ICS |
| 5 | 0.03 | 24 | 162 | 0.01 | 7 | 71 |
| 6 | 0.08 | 48 | 348 | 0.01 | 7 | 83 |
| 7 | 0.19 | 96 | 744 | 0.02 | 7 | 94 |
| 8 | 0.98 | 420 | 3426 | 0.05 | 29 | 461 |
| 9 | 2.78 | 936 | 7936 | 0.19 | 70 | 1205 |
| 10 | 8.60 | 2008 | 17567 | 0.26 | 85 | 1543 |
| 15 | — | — | — | 4.07 | 530 | 13468 | in a fraction of a second after eight refinements.

$(\alpha_1, k_1, b_1 k_2) \rightarrow (\alpha_2, 1+k_2, b_1, k_2) \rightarrow (\alpha_3, 1+k_2 \ b_1, k_2) \rightarrow (a_3, 1+k_2, b_2, 2+k_2) \rightarrow (\alpha_3, 1+k_2, b_3, 2+k_2)$ This counterexample actually represents a family of traces, since it is parameterized by the constants $k_1$, and $k_2$, with $k_1$, $k_2 \geq 0$, which have been introduced by the ICS decision procedures.

In the case of lazy theorem proving, the offline integration is particularly expensive, since restarts implies the reconstruction of ICS logical contexts repetitively.

In an online integration, choices for propositional variable assignments are synchronized with extending the logical context of the decision procedures with the corresponding atoms. Detection of inconsistencies in the logical context of the decision procedures triggers backtracking in the search for variable assignments. Furthermore, detected inconsistencies are propagated to the propositional search engine by adding the corresponding inconsistency clause (or, using an explanation function, a good overapproximation of the minimally inconsistent set of atoms in the logical context). Because state-of-the-art SAT solvers such as Chaff are missing the necessary API for realizing such an online integration, we developed a homegrown SAT solver which has most of the features of modern SAT solvers and integrated it with ICS. The results of using this online integration for the Bakery example can be found in Table 2 for two different configurations. For each configuration, we list the total time (in seconds), the number of conflicts detected by ICS, and the total number of calls to ICS. Altogether, using an explanation facility clearly pays off in that the number of refinement iterations (conflicts) is reduced considerably.

It will be appreciated that the preferred embodiments described above are cited by way of example, and that the invention is not limited to what has been particularly shown and described hereinabove. Rather, the scope of the invention includes both combinations and subcombinations of the various features described hereinabove, as well as variations and modifications thereof not disclosed in the prior art and which would occur to persons skilled in the art upon reading the foregoing description.

What is claimed is:

1. A method for performing bounded model checking to test if a property of interest is violated within a number of steps of a program, comprising:

unfolding the program for the number of steps to create a program formula;

translating the property of interest into an automaton;

encoding a transition system of said automaton into a Boolean formula creating a transition formula;

conjoining the program formula with the transition formula to create a conjoined formula, wherein the conjoined formula contains at least one state variable with a non-finite domain;

deciding a satisfiability of the conjoined formula, while maintaining the at least one state variable with a non-finite domain as a state variable with a non-finite domain, wherein the conjoined formula is satisfiable if there exists an assignment of values to variables of the conjoined formula that would make the conjoined formula true and wherein the conjoined formula is unsatisfiable if there does not exist an assignment of values to the variables of the conjoined formula that would make the conjoined formula true; and if the conjoined formula is satisfiable, outputting a signal that the property of interest is violated within the number of steps, and if the conjoined formula is unsatisfiable outputting a signal that the property of interest is not violated within the number of steps.

2. The method of claim 1, wherein the deciding further comprises:

generating a first candidate assignment for variables in said conjoined formula;

checking a validity of the first candidate assignment and if the first candidate assignment is valid, deciding that the conjoined formula is satisfiable;

where the first candidate assignment is not valid, generating a second candidate assignment for checking, wherein said second candidate assignment is different from the first candidate assignment;

when no said second candidate assignment exists, deciding that the conjoined formula is unsatisfiable.

3. The method of claim 2, wherein said checking the validity of the first candidate assignment uses a decision procedure.

4. The method of claim 2, wherein the first candidate assignment includes "don't care" values.

5. The method of claim 2, wherein the generating the second candidate assignment uses a Boolean analogue of the first candidate assignment to constrain the generating of the second candidate assignment.

6. The method of claim 5 wherein said Boolean analogue is generated from an over approximation of terms of the first candidate assignment.

7. The method of claim 2, wherein the generating the first candidate assignment is synchronized with the checking the validity of the first candidate assignment by extending a logical context of a checking means.

8. The method of claim 2, wherein the generating the second candidate assignment is synchronized with the checking the validity of the second candidate assignment by extending a logical context of a checking means.

9. The method of claim 2, wherein the deciding that the conjoined formula is unsatisfiable includes generating a counterexample showing why said conjoined formula is unsatisfiable.

10. The method of claim 2, wherein the generating the first candidate assignment includes generating a partial first candidate assignment for validity checking before generating a complete first candidate assignment.

11. The method of claim 2, wherein the generating the second candidate assignment generates a partial second candidate assignment for validity checking before generating a complete second candidate assignment.

12. The method of claim 1, wherein the automaton is a Büchi automaton.

13. The method of claim 1, wherein said program contains variables with non-finite domains.

14. The method of claim 1, wherein said property of interest contains constraints over non-finite domains.

15. The method of claim 1, wherein the program is a description of a system selected from a group comprising of: electronic circuits, computer architectures, nanoelectronic architectures, biological models, control systems, algorithms, and computer programs.

16. The method of claim 1, wherein the property of interest is expressed using linear-time temporal logic.

17. The method of claim 1, wherein the property of interest is a negation of a second property of interest and the program is a result of applying a k-induction rule to a second program, such that if the property of interest is not satisfiable then the second property of interest is proved to hold of the second program.

18. The method of claim 1, wherein the deciding the satisfiability of the conjoined formula further includes generating a counterexample when the conjoined formula is unsatisfiable.

19. The method of claim 18, wherein the property of interest is an unreachability of a particular state of the program.

20. The method of claim 19, wherein the counterexample is used as a test case for testing the program.

* * * * *